US010982840B2

(12) United States Patent
Van Bommel et al.

(10) Patent No.: US 10,982,840 B2
(45) Date of Patent: Apr. 20, 2021

(54) LIGHT EMITTING DEVICE

(71) Applicant: SIGNIFY HOLDING B.V., Eindhoven (NL)

(72) Inventors: Ties Van Bommel, Horst (NL); Anna Wilhelmina Maria Wondergem-De Best, Veldhoven (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

(21) Appl. No.: 16/963,850

(22) PCT Filed: Jan. 28, 2019

(86) PCT No.: PCT/EP2019/051944

§ 371 (c)(1),
(2) Date: Jul. 22, 2020

(87) PCT Pub. No.: WO2019/149642

PCT Pub. Date: Aug. 8, 2019

(65) Prior Publication Data

US 2021/0041096 A1 Feb. 11, 2021

(30) Foreign Application Priority Data

Feb. 1, 2018 (EP) .................................... 18154726

(51) Int. Cl.
*F21V 29/70* (2015.01)
*F21V 17/02* (2006.01)
(Continued)

(52) U.S. Cl.
CPC .............. *F21V 29/70* (2015.01); *F21V 17/02* (2013.01); *F21Y 2105/16* (2016.08); *F21Y 2115/10* (2016.08)

(58) Field of Classification Search
CPC ...... F21V 29/70; F21V 17/02; F21Y 2105/16; F21Y 2115/10
See application file for complete search history.

(56) References Cited

U.S. PATENT DOCUMENTS

2004/0223338 A1* 11/2004 Koike .................. F21S 41/663 362/545
2007/0230184 A1 10/2007 Shuy
(Continued)

FOREIGN PATENT DOCUMENTS

CN 101532624 A 9/2009
CN 201475813 U 5/2010
(Continued)

*Primary Examiner* — Rajarshi Chakraborty
*Assistant Examiner* — Glenn D Zimmerman
(74) *Attorney, Agent, or Firm* — Daniel J. Piotrowski

(57) ABSTRACT

A light emitting device comprising a base, a rod-shaped heat sink element extending from the base along a longitudinal axis of the light emitting device, the rod-shaped heat sink element comprising N sides. The N sides comprise at least one top side which in an assembled condition of the light emitting device faces away from an exit window of the light emitting device, at least one bottom side which in an assembled condition of the light emitting device faces towards an exit window of the light emitting device, and at least two mutually opposite sides extending between said at least one top side and said at least one bottom side. The N sides comprise M LED arrays, each comprising a plurality of LEDs, each LED of the plurality of LEDs comprising a respective light output surface arranged facing in a main direction. The at least one first LED array comprises a plurality of side emitting LEDs, the at least one second LED array comprises a plurality of top emitting LEDs and the at least one third LED array and the at least one fourth LED array each comprises a plurality of either side or top emitting LEDs.

15 Claims, 8 Drawing Sheets

(51) Int. Cl.
*F21Y 105/16* (2016.01)
*F21Y 115/10* (2016.01)

(56) References Cited

U.S. PATENT DOCUMENTS

| | | | | |
|---|---|---|---|---|
| 2010/0091507 | A1* | 4/2010 | Li | F21V 29/89 362/470 |
| 2010/0237365 | A1* | 9/2010 | Boonekamp | B32B 17/10761 257/91 |
| 2010/0253221 | A1* | 10/2010 | Chiang | F21K 9/232 315/32 |
| 2011/0193479 | A1* | 8/2011 | Nilssen | F21V 23/0492 315/35 |
| 2011/0298371 | A1* | 12/2011 | Brandes | F21K 9/23 315/32 |
| 2013/0083534 | A1 | 4/2013 | Chen et al. | |
| 2013/0148340 | A1 | 6/2013 | Shen | |
| 2016/0215943 | A1 | 7/2016 | Martin | |
| 2016/0319999 | A1* | 11/2016 | Elzinga | H01L 33/62 |
| 2018/0012872 | A1* | 1/2018 | Okui | H01L 25/0753 |

FOREIGN PATENT DOCUMENTS

| | | | |
|---|---|---|---|
| CN | 102062325 | A | 5/2011 |
| CN | 202791611 | U | 3/2013 |
| CN | 203099569 | U | 7/2013 |
| CN | 104930459 | A | 9/2015 |
| EP | 2236907 | A2 | 10/2010 |
| EP | 2341278 | A2 | 7/2011 |
| KR | 100622607 | B1 | 9/2006 |
| KR | 100968270 | B1 | 7/2010 |
| KR | 20100107619 | A | 10/2010 |
| KR | 20140115612 | A | 10/2014 |
| KR | 101595905 | B1 | 2/2015 |
| KR | 1691622 | B1 | 1/2017 |

* cited by examiner

LIGHT EMITTING DEVICE

CROSS-REFERENCE TO PRIOR APPLICATIONS

This application is the U.S. National Phase application under 35 U.S.C. § 371 of International Application No. PCT/EP2019/051944, filed on Jan. 28, 2019, which claims the benefit of European Patent Application No. 18154726.6, filed on Feb. 1, 2018. These applications are hereby incorporated by reference herein.

FIELD OF THE INVENTION

The invention concerns a light emitting device comprising a base, a rod-shaped heat sink element extending from the base along a longitudinal axis of the light emitting device, the rod-shaped heat sink element comprising N sides, N being an integer in the range of 4 to 10, the N sides comprising at least one top side which in an assembled condition of the light emitting device faces away from an exit window of the light emitting device, at least one bottom side which in an assembled condition of the light emitting device faces towards an exit window of the light emitting device, and at least two mutually opposite sides extending between said at least one top side and said at least one bottom side, and M LED arrays, M being an integer equal to or larger than 4, each of the M LED arrays comprising a plurality of LEDs, each LED of the plurality of LEDs comprising a respective light output surface arranged facing in a main direction, at least one first LED array of the M LED arrays being arranged at the at least one top side, at least one second LED array of the M LED arrays being arranged at the at least one bottom side and at least one third LED array of the M LED arrays and at least one fourth LED array of the M LED arrays being arranged at each of the at least two mutually opposite sides extending between said at least one top side and said at least one bottom side.

BACKGROUND OF THE INVENTION

High Pressure Sodium (HPS) lamps, such as SON-T, are used for road and residential lighting, decorative floodlighting, commercial and industrial applications, and recreational sports facilities indoor and outdoor. Such lamps comprise a bright arc which emits light omnidirectional and is placed in the optical center of a reflector of a luminaire which collects and redirects the light to, for example, a road.

Various LED configurations have been proposed to replace these high brightness—high lumen output lamps. For instance, a light emitting device which comprises a base which has a longitudinal axis and an elongated rod-shaped heat sink which is configured to remove heat from 6 LED arrays which are placed on different sides of the elongated rod-shaped heat sink has been proposed. Two further heat sinks may be arranged in thermal contact with and on both sides of the elongated rod-shaped heat sink.

One such possible solution is disclosed in KR 968270 B1, which describes a lamp with a rod shaped heat sink comprising a hexagonal cross section and with LED arrays mounted on all six surfaces of the rod shaped heat sink. All LED arrays are of identical configuration, i.e. of identical number of LEDs and arrangement of the LEDs in the array. Also, the lamp comprises a reflector for each array of LEDs.

However, the further heat sinks of the LED light emitting device are rather bulky in order to provide sufficient cooling. As a result, they block part of the direct light from the LED sources and part of the light which is being reflected by the reflector. The luminaire socket may also block the light which is being reflected by the reflector.

SUMMARY OF THE INVENTION

It is an object of the present invention to overcome this problem, and to provide a light emitting device which allows for achieving a direct replacement of a conventional high brightness light emitting device without modification of the associated luminaire and shows improved system efficiency.

According to a first aspect of the invention, this and other objects are achieved by means of a light emitting device of the type mentioned by way of introduction, where the at least one first LED array, the at least one second LED array, the at least one third LED array and the at least one fourth LED array are positioned such that the plurality of LEDs of each of the at least one first LED array, the at least one second LED array, the at least one third LED array and the at least one fourth LED extend in parallel the longitudinal axis of the light emitting device, and the light output surfaces of the plurality of LEDs of any one of the at least one first LED array, the at least one second LED array, the at least one third LED array and the at least one fourth LED extend in an angle with respect to the longitudinal axis of the light emitting device being different from the angle with respect to the longitudinal axis of the light emitting device in which the light output surfaces of the plurality of LEDs of the remaining ones of the at least one first LED array, the at least one second LED array, the at least one third LED array and the at least one fourth LED extend, and the at least one first LED array comprises a plurality of side emitting LEDs, the at least one second LED array comprises a plurality of top emitting LEDs and the at least one third LED array and the at least one fourth LED array each comprises a plurality of either side emitting LEDs or top emitting LEDs.

Thereby, a light emitting device is provided with a configuration of the LEDs which minimizes the amount of light blocked by other components of the light emitting device and of a lamp or luminaire in which the light emitting device is mounted.

Thus, a light emitting device is provided which allows for achieving a direct replacement of a conventional high brightness light emitting device without modification of the associated luminaire and which simultaneously shows improved system efficiency In an embodiment, the at least one third LED array and the at least one fourth LED array each comprises a plurality of top emitting LEDs if the two mutually opposite sides extending between said top side and said bottom side are arranged in an angle θ of 0 to 35 degrees with respect to the exit window of the light emitting device, and the at least one third LED array and the at least one fourth LED array each comprises a plurality of side emitting LEDs if the two mutually opposite sides extending between said top side and said bottom side are arranged in an angle θ of 35 to 180 degrees with respect to the exit window of the light emitting device.

Thereby, a light emitting device is provided with which the amount of LED light stemming from the third and fourth LED array, respectively, that is blocked by other components of the light emitting device and of a lamp or luminaire in which the light emitting device is mounted is optimally small. Such a light emitting device therefore has an even further improved efficiency.

In an embodiment, the at least one first LED array, which is arranged at the top side, comprises a plurality of side emitting LEDs arranged in a symmetric pattern to emit light to mutually opposite sides.

Thereby the above mentioned advantages are achieved while simultaneously providing for a particularly uniform light distribution at the exit window of the light emitting device as observed by a user.

In an embodiment, the at least one first LED array, the at least one second LED array, the at least one third LED array and the at least one fourth LED array is arranged on a carrier, the carrier being arranged on the rod-shaped heat sink element, and wherein the carrier is a one-piece element that may be bent around the rod-shaped heat sink element. In a further embodiment, the one-piece carrier is flexible.

thus finished configuration of LED arrays may be mounted on the rod shaped heat sink element in one operation.

In an embodiment, the one-piece carrier is shaped in accordance with the pattern of LEDs formed by the at least one first LED array, the at least one second LED array, the at least one third LED array and the at least one fourth LED array.

Thereby, a saving of carrier material is provided for, while also providing for a further degree in freedom in the design of the light emitting device.

In an embodiment, each of the at least one first LED array, the at least one second LED array, the at least one third LED array and the at least one fourth LED array is arranged on a respective separate carrier, the respective separate carriers being arranged on the rod-shaped heat sink element. In a further embodiment, the separate carriers are flexible.

Thereby, a high degree in flexibility of obtaining different configurations of LED array distribution on the sides of a light emitting device is provided for.

In an embodiment, the separate carriers are shaped in accordance with the pattern of LEDs formed by the at least one first LED array, the at least one second LED array, the at least one third LED array and the at least one fourth LED array.

Thereby, a saving of carrier material is provided for, while also providing for a further degree in freedom in the design of the light emitting device.

In an embodiment, N is an integer in the range of 4 to 8, or wherein N is an integer in the range of 4 to 6.

The inventors have shown that the above advantages are obtained for rod shaped heat sink elements with any number of sides N from 4 to 10. However, the advantages have turned out to be particularly profound for a number of sides being 4 to 8 and optimally profound for a number of sides N being 4, 5 or 6.

In an embodiment, M is an integer in the range of 4 to 10, or wherein M is an integer in the range of 4 to 8, or wherein M is an integer in the range of 4 to 6.

It may in some embodiments be preferred that the number of sides N of the rod shaped heat sink element and the number of LED arrays M are the same, such that each side of the rod shaped heat sink element is provided with an array of LEDs. This provides for a particularly simple light emitting device.

However, it is also possible and may be desirable that the number of LED arrays M is smaller than the number of sides N of the rod shaped heat sink element. This provides for a light emitting device which is cheaper and simpler to manufacture, as the number of LEDs and area of carrier required is kept low, and for a light emitting device in which even less light is blocked on the way to the exit window of the light emitting device.

In an embodiment, the light emitting device further comprises a rotation mechanism to rotate the rod-shaped heat sink element to a desired orientation.

Thereby it is ensured that the respective LED arrays are oriented in the desired direction, which in turn minimizes blockage of the light by the base and the possible additional heat sinks of the light emitting device as well as by the socket of a lamp or luminaire in which the light emitting device is employed.

The light emitting device may furthermore comprise a locking means for locking the orientation of the lamp. Thereby it is ensured that the desired orientation of the light emitting device, and thus the optimum efficiency of the light emitting device is upheld.

In some embodiments, the light emitting device may further comprise one or more of a driver, a controller, and an antenna. Advantages relating to each of these elements appear from the detailed description below.

In an embodiment, the light emitting device further comprises a rotation mechanism to rotate the rod-shaped heat sink element to a desired orientation, and the rotation mechanism is a weight arranged in the rod-shaped heat sink element.

Thereby it is ensured that the light emitting device is automatically upon being installed in a lamp or luminaire rotated in such a way that the respective LED arrays are oriented in the desired direction.

In an embodiment, the rod-shaped heat sink element comprises a heat pipe.

Thereby a light emitting device with an improved heat dissipation away from the LEDs, and thus an improved life time, is obtained.

The LEDs of the at least one first LED array, the at least one second LED array, the at least one third LED array and the at least one fourth LED array may emit one of:

white light, white light within 15 Standard Deviation Color Matching (SDCM) from the black body line, white light within 10 SDCM from the black body line, and white light within 8 SDCM from the black body line.

The LEDs of the at least one first LED array, the at least one second LED array, the at least one third LED array and the at least one fourth LED array may emit one of:

light of the same color temperature, light with a color temperature in the range from 2000 to 10000 K, light with a color temperature in the range from 2500 to 8000 K, light with a color temperature in the range from 3000 to 6000 K, The LEDs of the at least one first LED array, the at least one second LED array, the at least one third LED array and the at least one fourth LED array may emit one of:

light with a color rendering index (CRI) of at least 60, light with a CRI of at least 70, and light with a CRI of at least 80.

The invention furthermore, in a second aspect, concerns a lamp, a luminaire or a lighting fixture comprising a light emitting device according to the invention.

It is noted that the invention relates to all possible combinations of features recited in the claims.

BRIEF DESCRIPTION OF THE DRAWINGS

This and other aspects of the present invention will now be described in more detail, with reference to the appended drawings showing embodiment(s) of the invention.

As illustrated in the figures, the sizes of layers and regions are exaggerated for illustrative purposes and, thus, are provided to illustrate the general structures of embodiments of the present invention. Like reference numerals refer to like elements throughout.

DETAILED DESCRIPTION

The present invention will now be described more fully hereinafter with reference to the accompanying drawings, in which currently preferred embodiments of the invention are shown. This invention may, however, be embodied in many different forms and should not be construed as limited to the embodiments set forth herein; rather, these embodiments are provided for thoroughness and completeness, and fully convey the scope of the invention to the skilled person.

Figure 1:
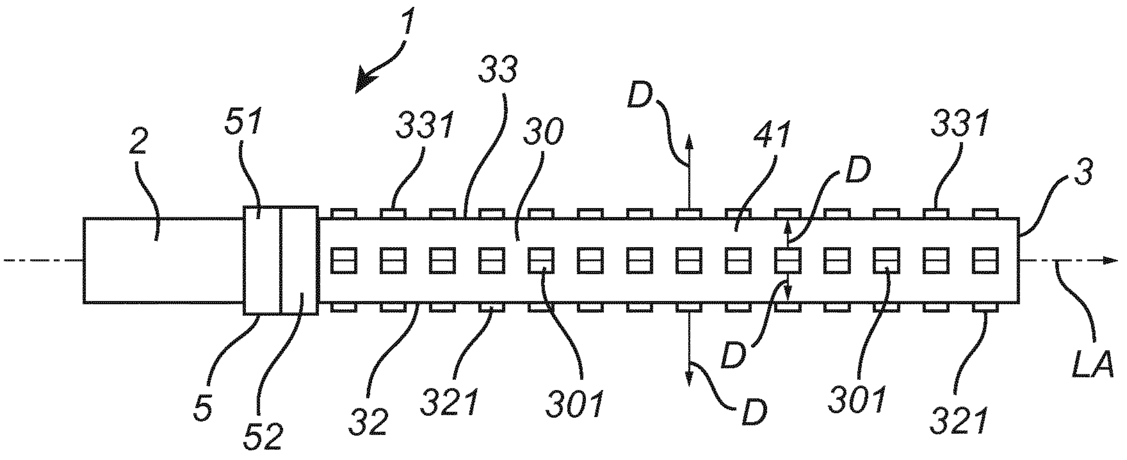
FIG. 1 shows a side view of a first embodiment of a light emitting device according to the invention and comprising a rod-shaped heat sink with four sides.
Figure 5:
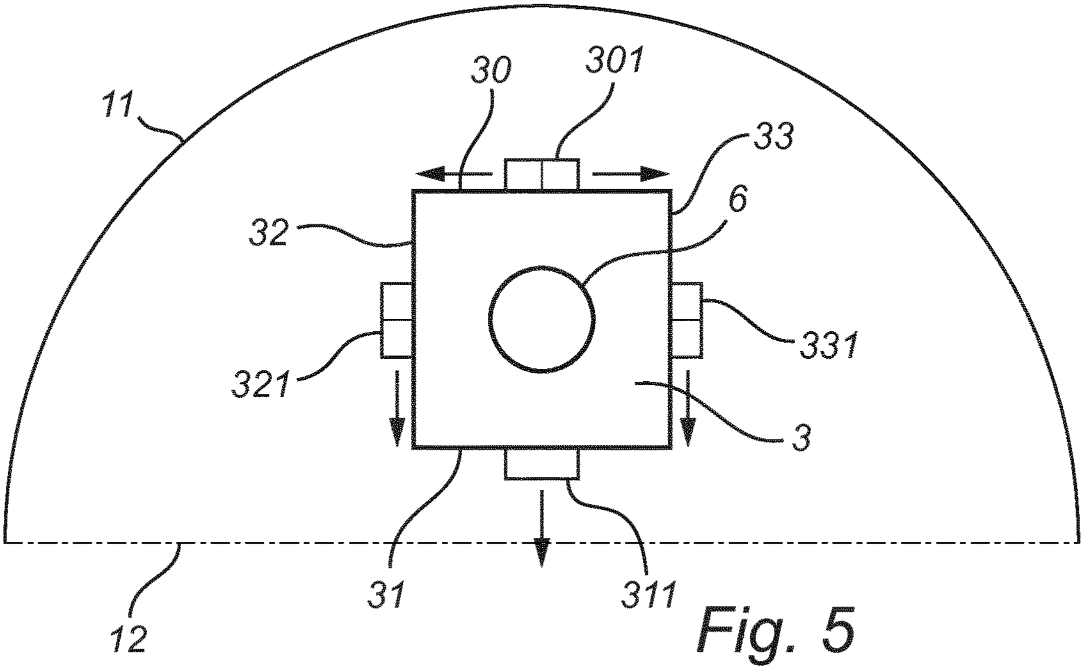
FIG. 5 shows a cross sectional view of the rod shaped heat sink element with LED arrays mounted thereon of the light emitting device according to any one of FIGS. 1 and 2.

FIG. 1 shows a top view of a light emitting device 1 according to a first embodiment of the invention. FIG. 5 shows a cross sectional view of the light emitting device 1 according to the first embodiment of the invention.

Generally, for all embodiments and as illustrated on FIG. 1, the light emitting device 1 comprises a longitudinal direction and a longitudinal axis LA extending in the longitudinal direction.

Generally, and for all embodiments, the light emitting device 1 further comprises a base 2, an optional rotation mechanism 5, a rod shaped heat sink element 3 and M LED arrays 301-391, M being an integer in the range from 4 to 10. Each LED array of the M LED arrays 301-391 generally comprises a plurality of LEDs. Each LED of the plurality of LEDs comprises a respective light output surface arranged facing in a main direction, D, cf. FIG. 1.

Generally, and for all embodiments, the rod shaped heat sink element 3 comprises N sides 30-39, N being an integer in the range of 4 to 10, and the M LED arrays 301-391 are arranged on the N sides of the rod shaped heat sink element 3. In other words, the rod shaped heat sink element 3 is generally a cylindrical element with an angular cross section with N sides. The N sides generally include at least one top side 30, at least one bottom side 31 and at least two mutually opposite sides 32 and 33 extending between a top side and a bottom side. The top side 30 is in an assembled condition of the light emitting device facing away from an exit window 12 of the light emitting device. The bottom side 31 is an assembled condition of the light emitting device facing towards an exit window 12 of the light emitting device. The exit window 12 will be described in further detail below with reference to FIGS. 3 and 4. In some embodiments the rod shaped heat sink element 3 may further comprise a heat pipe.

The plurality of LEDs of each LED array 301-391 may be any suitable type of LEDs and may emit light of any desired color and/or color temperature. Typically, however, the plurality of LEDs are LEDs emitting white light. For example, the plurality of LEDs emit one white light within 15 Standard Deviation Color Matching (SDCM) from the black body line, white light within 10 SDCM from the black body line, or white light within 8 SDCM from the black body line. The plurality of LEDs may further or alternatively emit light of the same color temperature, light with a color temperature in the range from 2000 to 10000 K, light with a color temperature in the range from 2500 to 8000 K or light with a color temperature in the range from 3000 to 6000 K. The plurality of LEDs may further or alternatively emit light with a color rendering index (CRI) of at least 60, light with a CRI of at least 70, or light with a CRI of at least 80.

The LED arrays 301-391 are mounted on a carrier or substrate 40*a*, 40*b*; 40-49. The carrier 40*a*, 40*b*; 40-49 may be flexible. The carrier may be one common carrier 40*a*, 40*b* carrying all M LED arrays 301-391 (cf. FIGS. 8 and 12). Alternatively, a separate carrier 40-49 may be provided for each of the M LED arrays 301-391 (cf. FIG. 6). The carrier 40*a*, 40*b*; 40-49 is a carrier suitable for carrying the plurality of LEDs and the wiring necessary to supply electrical power to the LEDs, such as but not limited to a printed circuit board.

More particularly, the plurality of LEDs of each of the M LED arrays 301-391 is generally and for all embodiments arranged on the carrier 40*a*, 40*b*; 40-49 in such a way as to extend in a direction parallel with the longitudinal axis LA of the light emitting device. The plurality of LEDs of each of the M LED arrays 301-391 may be arranged asymmetrically on the carrier 40*a*, 40*b*; 40-49 with respect to the longitudinal axis LA of the light emitting device. In other embodiments, however, the plurality of LEDs of each of the M LED arrays 301-391 may be arranged symmetrically on the carrier 40*a*, 40*b*; 40-49 with respect to the longitudinal axis LA of the light emitting device.

The plurality of LEDs of each of the M LED arrays 301-391 is generally and for all embodiments furthermore arranged on the carrier 40*a*, 40*b*; 40-49 in such a way that the light output surfaces of the plurality of LEDs of any one of the M LED arrays 301-391 extend in an angle with respect to the longitudinal axis LA of the light emitting device being different from the angle with respect to the longitudinal axis LA of the light emitting device in which the light output surfaces of the plurality of LEDs of the remaining ones of the M LED arrays 301-391 extend.

In the particular embodiment shown in FIG. 1, the light emitting device 1 comprises a rod shaped heat sink element 3 with four sides 30, 31, 32, 33, of which the one side is not visible on FIG. 1, and four LED arrays 301, 311, 321, 331, of which the one LED array is likewise not visible on FIG. 1. A first LED array 301 is arranged on a first side or top side 30 of the heat sink element 3. The top side 30 is in an assembled condition of the light emitting device 1 intended to face away from an exit window 12 (FIGS. 3 and 4) of the light emitting device 1. The exit window 12 will be described in further detail below with reference to FIGS. 3 and 4. A second LED array 311 (not visible on FIG. 1—cf. instead FIG. 5) of the M LED arrays is arranged on a second side or bottom side 31 (cf. likewise FIG. 5) of the heat sink element 3. The bottom side is in an assembled condition of the light emitting device 1 intended to face towards the exit window 12 of the light emitting device 1. A third LED array 32 and a fourth LED array 33 are arranged on the remaining two sides 32, 33 of the heat sink element 3. The two sides 23, 33 are mutually opposite sides extending between the bottom side and the top side 30.

Figure 2:
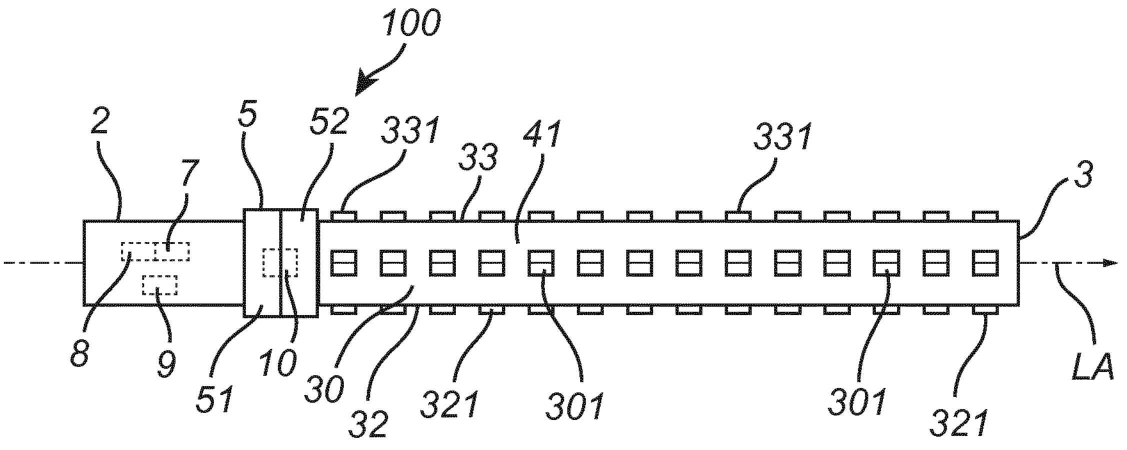
FIG. 2 shows a side view of a second embodiment of a light emitting device according to the invention and comprising a rod-shaped heat sink with four sides.

Furthermore, as is illustrated on FIGS. 1, 2 and 5, the first LED array 301 comprises a plurality of side emitting LEDs, the at least one second LED array 311 (not visible on FIG. 1—cf. instead FIG. 5) comprises a plurality of top emitting LEDs and the at least one third LED array 321 and the at least one fourth LED array 331 each comprises a plurality of top emitting LEDs. This configuration is also schematically illustrated in FIG. 9A by means of arrows indicating the direction of emission of the respective LED arrays.

Figure 9A:
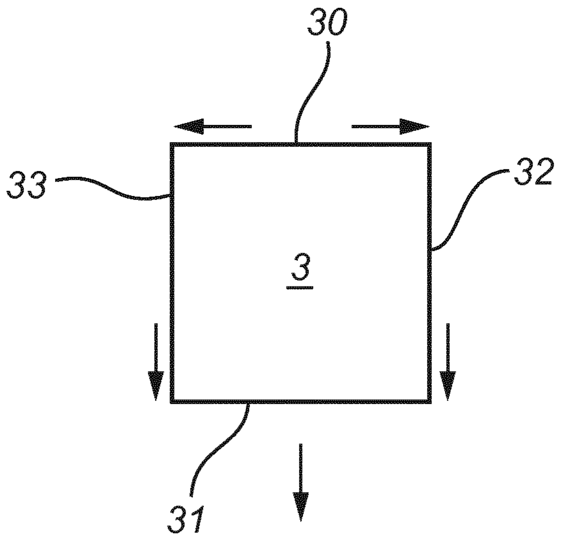
FIGS. 9A and 9B show schematic cross sectional views of different configurations of the LED arrays of a light emitting device according to the invention and comprising a rod-shaped heat sink with four sides, the LEDs of the LED arrays for simplicity being symbolized only by arrows denoting their main emission direction.
Figure 9B:
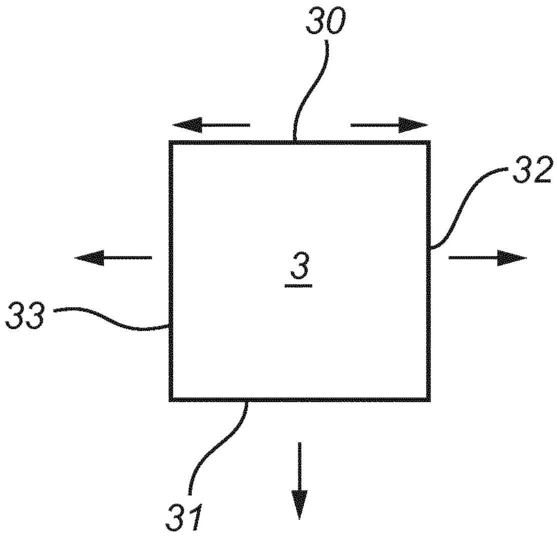

In an alternative configuration the at least one third LED array 321 and the at least one fourth LED array 331 each comprises a plurality of side emitting LEDs. This configuration is schematically illustrated in FIG. 9B by means of arrows indicating the direction of emission of the respective LED arrays.

FIG. 2 shows a top view of a light emitting device 100 according to a second embodiment of the invention. The light emitting device 100 differs from the light emitting device 1 according to the first embodiment of the invention and described above only in comprising the following features.

The light emitting device 100 comprises a rotation mechanism 5, a driver 7, a controller 8, an antenna 9 and a locking mechanism 10.

Where provided, the rotation mechanism 5 is generally configured to rotate the rod-shaped heat sink element 3 to a desired orientation. In the embodiment shown on FIG. 2, the rotation mechanism 5 comprises a first part 51 and a second part 52 which are connected such as to be rotatable with respect to one another. The locking mechanism 10 is arranged and configured to allow releasable locking of the rotation mechanism 5 when the rod shaped heat sink element 3 is in the desired position. In the embodiment shown on FIG. 2, locking mechanism 10 is arranged and configured to allow releasable locking of the first part 51 and the second part 52 with respect to each other.

Where provided, the driver 7 is configured to drive the light emitting device 100. More particularly, the driver 7 may be configured to drive one or more of the rotation mechanism 5, the locking mechanism 10, the antenna 9 and the plurality of LED arrays 301-331. For instance, the driver 7 may be configured to adapt the input current to provide a suitable current to the LEDs of the LED arrays 301-331. Thus, the driver 7 may be configured to drive the intensity of the plurality of LED arrays 301-331 and/or to turn one or more LED arrays of the plurality of LED arrays 301-331 on and off.

Where provided, the controller 8 is configured to control the operation of the light emitting device 100. More particularly, the controller 8 may be configured to control the operation of one or more of the rotation mechanism 5, the driver 7, the antenna 9, the locking mechanism 10 and the plurality of LED arrays 301-331.

Where provided, the antenna 9 is configured to send and receive signals over a wired or wireless connection and to transmit received signals to one or more of the controller 8, the driver 7, the rotation mechanism 5 and the locking mechanism 10, thus allowing remote control of the light emitting device 100.

Figure 3:
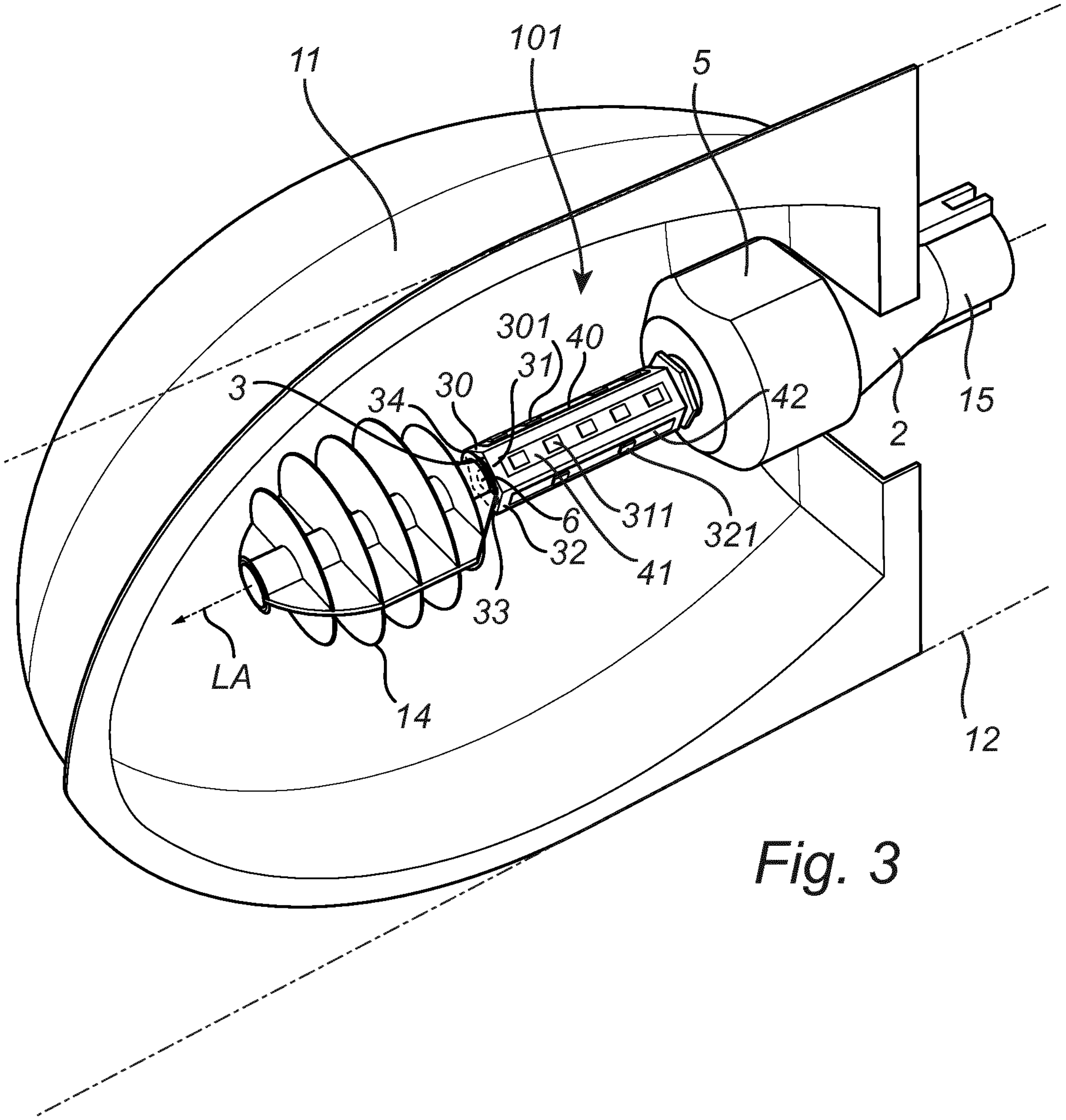
FIG. 3 shows a perspective view of a lamp comprising a light emitting device according to a third embodiment of the invention and comprising a rod-shaped heat sink with five sides.

FIG. 3 shows a perspective view of a lamp 20 comprising a light emitting device 101 according to a third embodiment of the invention. The light emitting device 101 of the lamp 20 differs from the light emitting devices according to the first and second embodiment of the invention and described above only in virtue of the following features.

The light emitting device 101 comprises a rod shaped heat sink element 3 with N=five sides 30-34. The five sides may be of identical size or they may differ in size. The five sides comprise a top side 30, two bottom sides 31 and 34 and two mutually opposite sides 32 and 33 extending between one of the bottom sides 31 or 34 and the top side 30.

The light emitting device 101 further comprises M=5 LED arrays 301, 311, 331 of which two are not visible on FIG. 3. The five LED arrays are arranged one array on each of the five sides 30-34 of the rod shaped heat sink element 3. In an alternative the light emitting device 101 may comprise N=3 or 4 LED arrays.

Figure 10A:
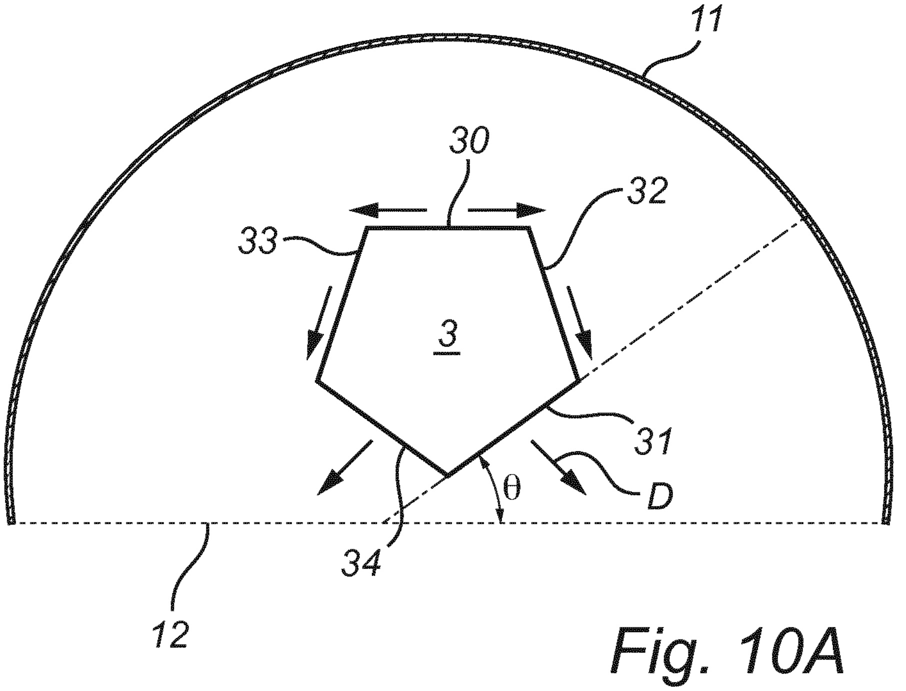
FIGS. 10A, 10B and 10C show schematic cross sectional views of different configurations of the LED arrays of a light emitting device according to the invention and comprising a rod-shaped heat sink with five sides, the LEDs of the LED arrays for simplicity being symbolized only by arrows denoting their main emission direction.

Furthermore, the first LED array 301 comprises a plurality of side emitting LEDs, the second LED array 311 and the fifth LED array (arranged on the side 34 and thus not visible) comprises a plurality of top emitting LEDs and the third LED array (arranged on the side 32 and thus not visible) and the fourth LED array 331 each comprises a plurality of top emitting LEDs. This configuration is also schematically illustrated in FIG. 10A by means of arrows indicating the direction of emission of the respective LED arrays.

Alternative configurations feasible for a light emitting device with a rod shaped heat sink element 3 having N=5 sides include the following.

Figure 10B:
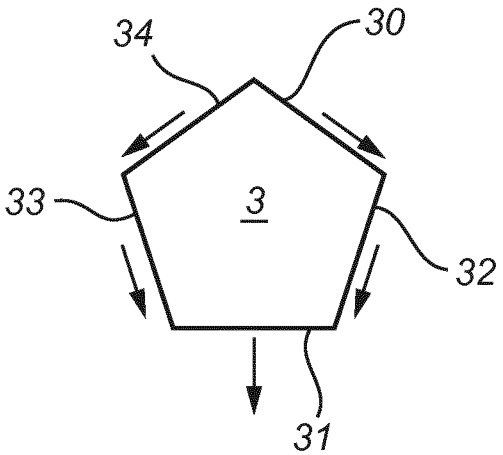

In one configuration, which is schematically illustrated in FIG. 10B by means of arrows indicating the direction of emission of the respective LED arrays, the light emitting device comprises a rod shaped heat sink element 3 with N=five sides 30-34. The five sides may be of identical size or they may differ in size. The five sides comprise two top sides 30 and 34, one bottom side 31 and two mutually opposite sides 32 and 33 extending between one of the top sides 30 or 34 and the bottom side 31. Five LED arrays are arranged one array on each of the five sides 30-34 of the rod shaped heat sink element 3. Of these five LED arrays, a first LED array and a fifth LED array arranged on the top sides 30 and 34, respectively, each comprises a plurality of side emitting LEDs, a second LED array arranged on the bottom side 30 comprises a plurality of top emitting LEDs and a third LED array and a fourth LED array arranged on the remaining sides 32 and 33, respectively, each comprises a plurality of side emitting LEDs.

Figure 10C:
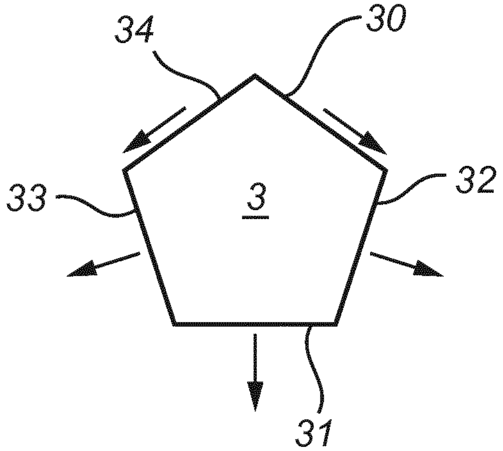

In another configuration, which is schematically illustrated in FIG. 10C by means of arrows indicating the direction of emission of the respective LED arrays, the light emitting device comprises a rod shaped heat sink element 3 with N=five sides 30-34. The five sides may be of identical size or they may differ in size. The five sides comprise two top sides 30 and 34, one bottom side 31 and two mutually opposite sides 32 and 33 extending between one of the top sides 30 or 34 and the bottom side 31. Five LED arrays are arranged one array on each of the five sides 30-34 of the rod shaped heat sink element 3. Of these five LED arrays, a first LED array and a fifth LED array arranged on the top sides 30 and 34, respectively, each comprises a plurality of side emitting LEDs, a second LED array arranged on the bottom side 30 comprises a plurality of top emitting LEDs and a third LED array and a fourth LED array arranged on the remaining sides 32 and 33, respectively, each comprises a plurality of top emitting LEDs.

Furthermore, now again referring to FIG. 3, the light emitting device 101 comprises a weight 6 arranged in the rod-shaped heat sink element 3. The weight 6 acts as a rotation mechanism configured to rotate the rod-shaped heat sink element 3 to a desired orientation.

Also, the light emitting device 101 comprises a heat sink 14 further to the rod-shaped heat sink element 3 for improved heat dissipation away from the LEDs. This may, indeed, be the case for any light emitting device according to the invention.

FIG. 3 further illustrates the exit window 12 of a light emitting device according to the invention. The exit window 12 is defined as a plane through which it is desired that the light emitting device emits its light.

The lamp 20 shown in FIG. 3 therefore further comprises a reflector 11 arranged and configured to collect light emitted by the light emitting device 101 and to reflect the collected light towards the exit window 12 of the light emitting device 101.

Generally, in the assembled condition of the lamp 20, the first LED array 301 is thus arranged on a first or top side 30 of the heat sink element 3, which top side 30 in an assembled condition of the light emitting device 1 is intended to face towards the reflector 11 and thus away from an exit window 12 of the light emitting device 101. Likewise, the second LED array 31 of the M LED arrays is arranged on a second or bottom side 31 of the heat sink element 3, which second side 31 is intended to face away from the reflector 11 and thus towards the exit window 12 of the light emitting device 101. In the embodiment shown in FIG. 3 this also applies to a fifth LED array arranged on the side 34. As mentioned above, a third LED array 32 and a fourth LED array (not visible) are arranged on the remaining two sides 32, 33 of the heat sink element 3.

The lamp 20 furthermore comprises a socket 15 attached to the base 2 of the light emitting device. The socket 15 provides a connection between the lamp 20 and an external source of electricity in a manner known per se.

Figure 4:
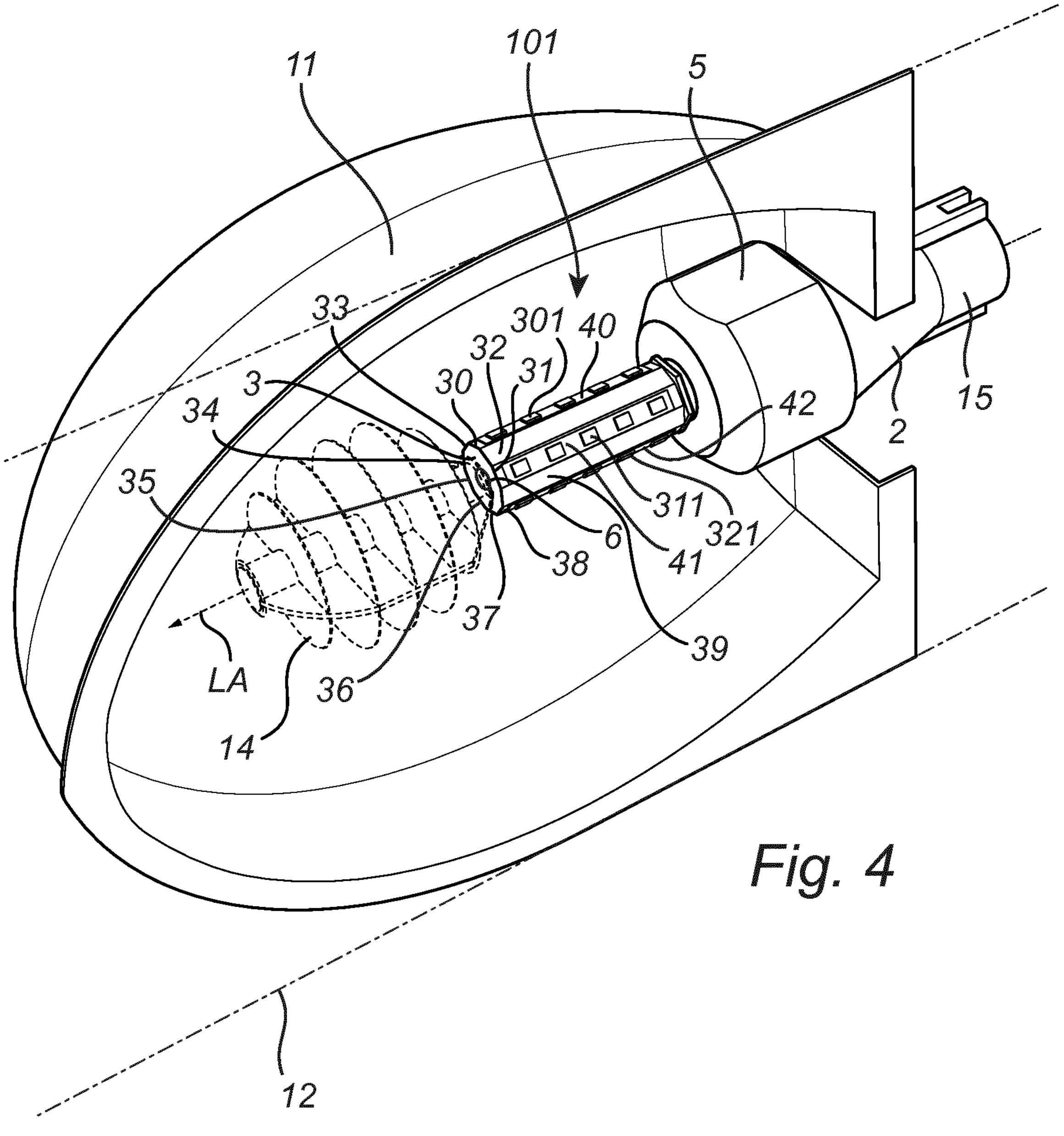
FIG. 4 shows a perspective view of a lamp comprising a light emitting device according to a fourth embodiment of the invention and comprising a rod-shaped heat sink with ten sides.

FIG. 4 shows a perspective view of a lamp 20 comprising a light emitting device 102 according to a fourth embodiment of the invention. The light emitting device 102 differs from the light emitting devices according to the first to third embodiments of the invention and described above only in virtue of the following features.

The light emitting device 102 comprises a rod-shaped heat sink element 3 with N=ten sides 30-39. The ten sides may be of identical size or they may differ in size. The light emitting device 101 further comprises M=10 LED arrays 301-391 of which 2 are not visible on FIG. 4. In an alternative the light emitting device 102 may comprise M LED arrays, where M is in the range of 3 to 9.

Furthermore, FIG. 4 illustrates that generally, and for all embodiments, the mutually opposite sides 32 and 33 extending between the top side 30 and the bottom side 31 are arranged in an angle θ with respect to the exit window 12 of the light emitting device. This is also illustrated in FIG. 9A.

More particularly, but still generally, and for all embodiments, if the mutually opposite sides 32 and 33 are arranged in an angle θ of 0 to 35 degrees with respect to the exit window 12 of the light emitting device, the at least one third LED array 321 and the at least one fourth LED array 331 each comprises a plurality of top emitting LEDs. If, on the other hand, the two mutually opposite sides 32 and 33 are arranged in an angle θ of 35 to 180 degrees with respect to the exit window 12 of the light emitting device, the at least one third LED array 321 and the at least one fourth LED array 331 each comprises a plurality of side emitting LEDs.

Turning now to FIGS. 5 to 8 different embodiments of configuration of the LED arrays 301-331 of a light emitting device according to the first embodiment of the invention will be described.

FIG. 5 illustrates that the LEDs of the first LED array 301 may be side emitting LEDs emitting light to two opposite sides, both being perpendicular to the longitudinal axis LA of the light emitting device.

Figure 6:
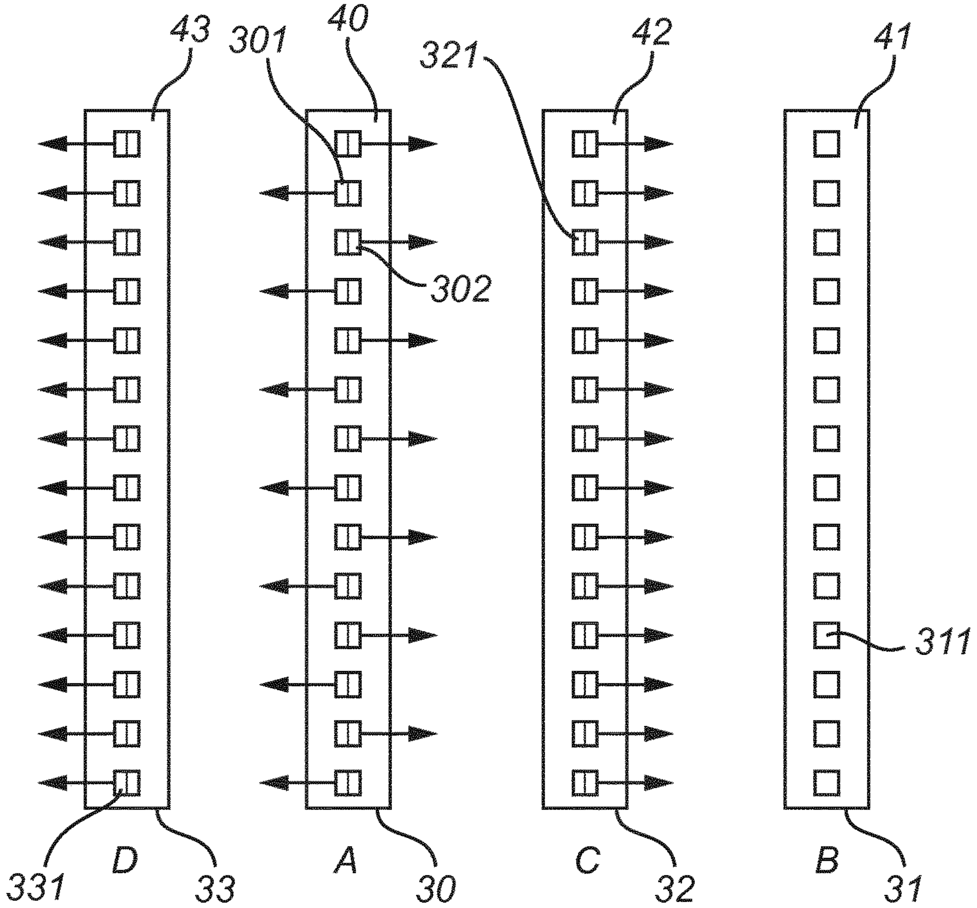
FIG. 6 shows a schematic top view of the LED arrays of the light emitting device according to any one of FIGS. 1, 2 and 5, the LED arrays being arranged on separate carriers.

FIG. 6 shows a configuration in which the first LED array 301 comprises a plurality of side emitting LEDs arranged one and one such that the LEDs alternatingly emit light to two opposite sides, both being perpendicular to the longitudinal axis LA of the light emitting device. The second LED array 311 comprises a plurality of top emitting LEDs. The third LED array 321 and the fourth LED array 331 each comprises a plurality of side emitting LEDs all emitting light to the same side. Also the Led arrays 301-331 are arranged each on a separate carrier 40-43.

Figure 7:
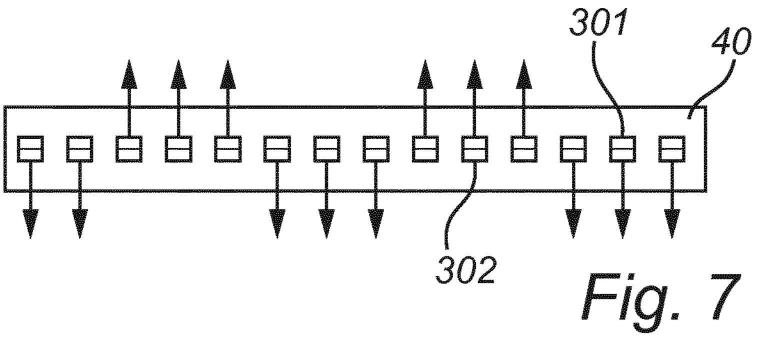
FIG. 7 shows a schematic top view of an alternative configuration of the LED array arranged on a top surface of the light emitting device according to the invention.

FIG. 7 shows an alternative configuration of the first LED array 301. Here the first LED array 301 comprises a plurality of side emitting LEDs arranged in groups three and three such that the said groups of LEDs alternatingly emit light to two opposite sides, both being perpendicular to the longitudinal axis LA of the light emitting device. Groups of e.g. two or four LEDs arranged in this way is of course also feasible, as is groups of LEDs of different sizes arranged in the same manner.

Figure 8:
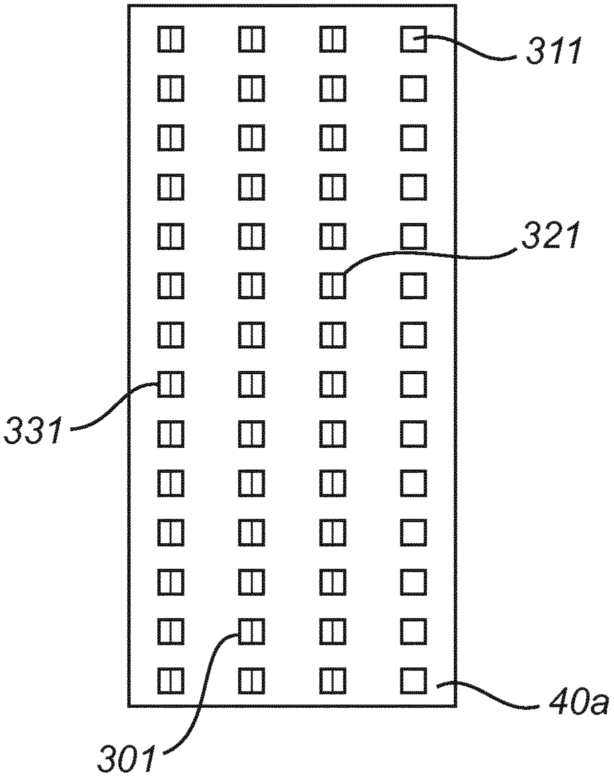
FIGS. 8 shows schematic top views of two alternative configuration of the carrier on which the LED arrays of a light emitting device according to the invention are arranged.

FIG. 8 shows the same configuration as shown in FIG. 6 and described above. However, the four arrays of LEDs 301-331 are here arranged on one common one-piece carrier 40*a*. It is also feasible to provide the arrays of LEDs 301-331 with different sizes and/or shapes, and to arrange the arrays of LEDs 301-331 on one common one-piece carrier 40*b* which is shaped according to the shape of the LED arrays.

Turning now finally to FIGS. 11A to 11D, different configurations of the LED arrays on a light emitting device comprising a rod shaped heat sink element 3 with N=6 sides 30-35 and M=6 LED arrays arranged one on each of the six sides 30-35 will be described.

Figure 11A:
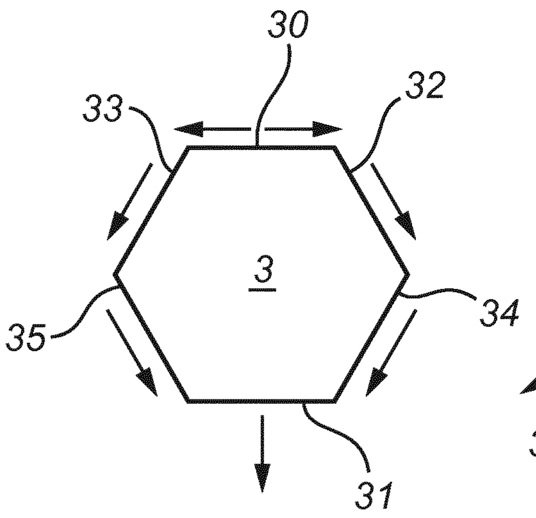
FIGS. 11A, 11B, 11C and 11D show schematic cross sectional views of different configurations of the LED arrays of a light emitting device according to the invention and comprising a rod-shaped heat sink with six sides, the LEDs of the LED arrays for simplicity being symbolized only by arrows denoting their main emission direction.

In one configuration, which is schematically illustrated in FIG. 11A by means of arrows indicating the direction of emission of the respective LED arrays, the six sides comprise one top side 30, one bottom side 31 and two times two mutually opposite sides 32, 33 and 34, 35, respectively extending between the top side 30 and the bottom side 31. Of the six LED arrays, a first LED array arranged on the top side 30 comprises a plurality of side emitting LEDs and a second LED array arranged on the bottom side 31 comprises a plurality of top emitting LEDs. A third, fourth, fifth and sixth LED array arranged on the remaining sides 32, 33, 34 and 35, respectively, each comprises a plurality of side emitting LEDs.

Figure 11B:
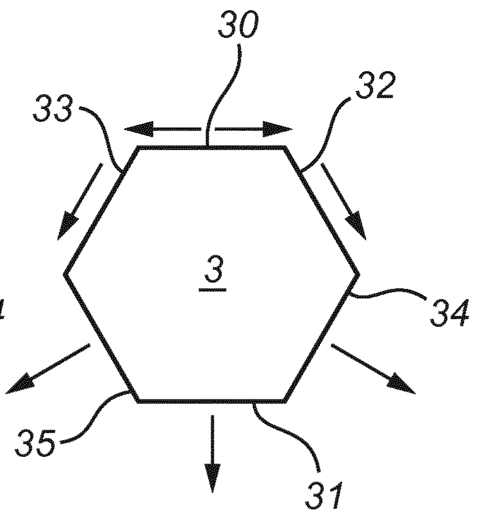

In another configuration, which is schematically illustrated in FIG. 11B by means of arrows indicating the direction of emission of the respective LED arrays, the six sides comprise one top side 30, one bottom side 31 and two times two mutually opposite sides 32, 33 and 34, 35, respectively extending between the top side 30 and the bottom side 31. Of the six LED arrays, a first LED array arranged on the top side 30 comprises a plurality of side emitting LEDs and a second LED array arranged on the bottom side 31 comprises a plurality of top emitting LEDs. A third and a fourth LED array arranged on the mutually opposite sides 32 and 33, respectively, adjoining the top side 30 each comprises a plurality of side emitting LEDs. Finally, a fifth and a sixth LED array arranged on the mutually opposite sides 34 and 35, respectively, adjoining the bottom side 31 each comprises a plurality of top emitting LEDs.

Figure 11C:
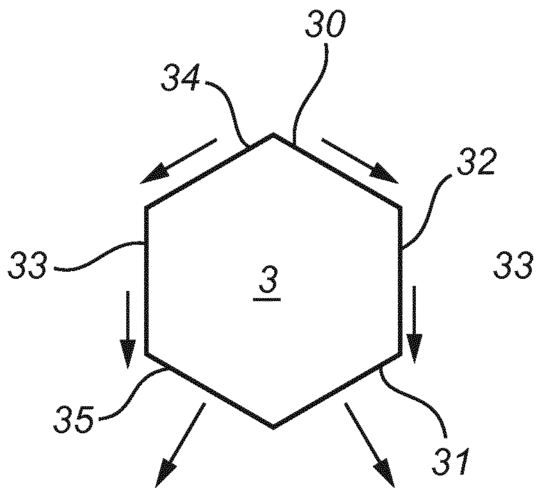

In another configuration, which is schematically illustrated in FIG. 11C by means of arrows indicating the direction of emission of the respective LED arrays, the six sides comprise two top sides 30 and 34, two bottom sides 31 and 35 and two mutually opposite sides 32, 33 extending between one of the two top sides 30, 34 and one of the two bottom sides 31, 35. Of the six LED arrays, a first LED array arranged on the top side 30 and a fifth LED array arranged on the top side 34 each comprise a plurality of side emitting LEDs. A second LED array arranged on the bottom side 31 and a sixth LED array arranged on the bottom side 35 each comprises a plurality of top emitting LEDs. A third and a fourth LED array arranged on the mutually opposite sides 32 and 33, respectively, each comprises a plurality of side emitting LEDs.

Figure 11D:
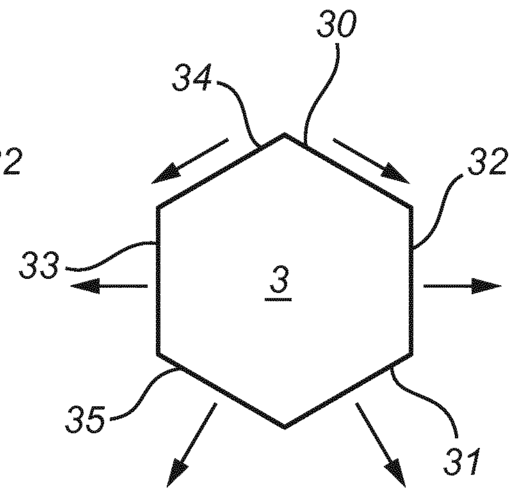

In yet another configuration, which is schematically illustrated in FIG. 11D by means of arrows indicating the direction of emission of the respective LED arrays, the six sides comprise two top sides 30 and 34, two bottom sides 31 and 35 and two mutually opposite sides 32, 33 extending between one of the two top sides 30, 34 and one of the two bottom sides 31, 35. Of the six LED arrays, a first LED array arranged on the top side 30 and a fifth LED array arranged on the top side 34 each comprise a plurality of side emitting LEDs. A second LED array arranged on the bottom side 31 and a sixth LED array arranged on the bottom side 35 each comprises a plurality of top emitting LEDs. A third and a fourth LED array arranged on the mutually opposite sides 32 and 33, respectively, each comprises a plurality of top emitting LEDs.

The six sides 30-35 of the rod shaped heat sink element 3 shown in FIGS. 11A-11D are all of identical size, but may in other embodiments be differing in size.

The person skilled in the art realizes that the present invention by no means is limited to the preferred embodiments described above. On the contrary, many modifications and variations are possible within the scope of the appended claims. For instance, various configurations analogous to those described for rod shaped heat sink elements with N=4, 5 and 6 sides above, may also be envisaged for rod shaped heat sink elements with another number N of sides, such as N=7, 8, 9 or 10 sides. Further, within one LED array top and side emitting LEDs may be combined.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

The invention claimed is:

1. A light emitting device comprising:

a base, a rod-shaped heat sink element extending from the base along a longitudinal axis (LA) of the light emitting device, the rod-shaped heat sink element comprising N sides, N being an integer in the range of 4 to 10, the N sides comprising:

at least one top side which in an assembled condition of the light emitting device faces away from an exit window of the light emitting device, at least one bottom side which in an assembled condition of the light emitting device faces towards an exit window of the light emitting device, and at least two mutually opposite sides extending between said at least one top side and said at least one bottom side, and M LED arrays, M being an integer equal to or larger than 4, each of the M LED arrays comprising a plurality of LEDs, each LED of the plurality of LEDs comprising a respective light output surface arranged facing in a main direction (D), at least one first LED array of the M LED arrays being arranged at the at least one top side, at least one second LED array of the M LED arrays being arranged at the at least one bottom side and at least one third LED array of the M LED arrays and at least one fourth LED array of the M LED arrays being arranged at each of the at least two mutually opposite sides extending between said at least one top side and said at least one bottom side, wherein the at least one first LED array, the at least one second LED array, the at least one third LED array and the at least one fourth LED array are positioned such that the plurality of LEDs of each of the at least one first LED array, the at least one second LED array, the at least one third LED array and the at least one fourth LED extend in parallel to the longitudinal axis of the light emitting device, and the light output surfaces of the plurality of LEDs of any one of the at least one first LED array, the at least one second LED array, the at least one third LED array and the at least one fourth LED extend in an angle with respect to the longitudinal axis of the light emitting device being different from the angle with respect to the longitudinal axis of the light emitting device in which the light output surfaces of the plurality of LEDs of the remaining ones of the at least one first LED array, the at least one second LED array, the at least one third LED array and the at least one fourth LED extend, and wherein the at least one first LED array comprises a plurality of side emitting LEDs, the at least one second LED array comprises a plurality of top emitting LEDs and the at least one third LED array and the at least one fourth LED array each comprises a plurality of either side emitting LEDs or top emitting LEDs.

2. The light emitting device according to claim 1, wherein if the two mutually opposite sides extending between said top side and said bottom side are arranged in an angle θ of 0 to 35 degrees with respect to the exit window of the light emitting device, the at least one third LED array and the at least one fourth LED array each comprises a plurality of top emitting LEDs, and if the two mutually opposite sides extending between said top side and said bottom side are arranged in an angle θ of 35 to 180 degrees with respect to the exit window of the light emitting device, the at least one third LED array and the at least one fourth LED array each comprises a plurality of side emitting LEDs.

3. The light emitting device according to claim 1, wherein the at least one first LED array, which is arranged at the top side, comprises a plurality of side emitting LEDs arranged in a symmetric pattern to emit light to mutually opposite sides.

4. The light emitting device according to claim 1, wherein the at least one first LED array, the at least one second LED array, the at least one third LED array and the at least one fourth LED array is arranged on a carrier, the carrier being arranged on the rod-shaped heat sink element, and wherein the carrier is a one-piece element that may be bent around the rod-shaped heat sink element.

5. The light emitting device according to claim 1, wherein each of the at least one first LED array, the at least one second LED array, the at least one third LED array and the at least one fourth LED array is arranged on a respective separate carrier, the respective separate carriers being arranged on the rod-shaped heat sink element.

6. The light emitting device according to claim 1, wherein N is an integer in the range of 4 to 8, or wherein N is an integer in the range of 4 to 6, and/or wherein M is an integer in the range of 4 to 10, or wherein M is an integer in the range of 4 to 8, or wherein M is an integer in the range of 4 to 6.

7. The light emitting device according to claim 1, and further comprising one or more of:

a rotation mechanism to rotate the rod-shaped heat sink element to a desired orientation, a locking means for locking the orientation of the lamp, a driver, a controller, and an antenna.

8. The light emitting device according to claim 1, and further comprising a rotation mechanism to rotate the rod-shaped heat sink element to a desired orientation, wherein the rotation mechanism is a weight arranged in the rod-shaped heat sink element.

9. The light emitting device according to any claim 1, wherein the rod-shaped heat sink element comprises a heat pipe.

10. The light emitting device according to claim 1, wherein the LEDs of the at least one first LED array, the at least one second LED array, the at least one third LED array and the at least one fourth LED array emit one of:

white light, white light within 15 Standard Deviation Color Matching (SDCM) from the black body line, white light within 10 SDCM from the black body line, and white light within 8 SDCM from the black body line.

11. The light emitting device according to claim 1, wherein the LEDs of the at least one first LED array, the at least one second LED array, the at least one third LED array and the at least one fourth LED array emit one of:

light of the same color temperature, light with a color temperature in the range from 2000 to 10000 K, light with a color temperature in the range from 2500 to 8000 K, and light with a color temperature in the range from 3000 to 6000 K.

12. The light emitting device according to claim 1, wherein the LEDs of the at least one first LED array, the at least one second LED array, the at least one third LED array and the at least one fourth LED array emit one of:

light with a color rendering index (CRI) of at least 60, light with a CRI of at least 70, and light with a CRI of at least 80.

13. A lamp, a luminaire or a lighting fixture comprising a light emitting device according to claim 1.

14. The light emitting device according to claim 4, wherein the one-piece carrier is shaped in accordance with the pattern of LEDs formed by the at least one first LED array, the at least one second LED array, the at least one third LED array and the at least one fourth LED array, and/or wherein the one-piece carrier is flexible.

15. The light emitting device according to claim 5, wherein the separate carriers are shaped in accordance with the pattern of LEDs formed by the at least one first LED array, the at least one second LED array, the at least one third LED array and the at least one fourth LED array ay, and/or wherein the separate carriers are flexible.

* * * * *